(12) United States Patent
Hirano et al.

(10) Patent No.: US 6,320,737 B1
(45) Date of Patent: *Nov. 20, 2001

(54) ELECTROSTATIC CHUCKING DEVICE

(75) Inventors: Shinsuke Hirano; Tomohide Jozaki, both of Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/572,904

(22) Filed: May 17, 2000

Related U.S. Application Data

(62) Division of application No. 08/879,221, filed on Jun. 19, 1997, now Pat. No. 6,084,763.

(30) Foreign Application Priority Data

Jun. 21, 1996 (JP) ................................................. 8-161211

(51) Int. Cl.[7] .................................................. H02H 13/00
(52) U.S. Cl. ........................................... 361/234; 361/235
(58) Field of Search ...................................... 361/234, 235

(56) References Cited

U.S. PATENT DOCUMENTS

| | | | |
|---|---|---|---|
| 5,548,470 | 8/1996 | Husian et al. | 361/234 |
| 5,681,424 | 10/1997 | Saito et al. | 156/643.1 |
| 5,684,669 | 11/1997 | Collins et al. | 361/234 |
| 5,708,556 | 1/1998 | Van Os et al. | 361/234 |
| 5,919,689 | 6/1999 | Collins et al. | 428/463 |
| 5,942,075 | 8/1999 | Nagabata et al. | 156/345 |
| 5,997,962 | 12/1999 | Ogasawara et al. | 427/535 |
| 6,084,763 * | 7/2000 | Hirano et al. | 361/234 |

FOREIGN PATENT DOCUMENTS

| | | |
|---|---|---|
| 4-87321 | 4/1992 | (JP). |
| 8-31919 | 8/1996 | (JP). |

* cited by examiner

*Primary Examiner*—Stephen W. Jackson
(74) *Attorney, Agent, or Firm*—Sonnenschein, Nath & Rosenthal

(57) ABSTRACT

The electrostatic chucking device 2 comprises an electrostatic chuck 4; a temperature detecting unit 10 for detecting the temperature of the electrostatic chuck 4; a power supply 9 connected to the electrostatic chuck 4 and used for impressing a DC voltage to the electrostatic chuck 4 to provide it with an attracting force; and a controller 11 for controlling the value of the DC voltage impressed by the power supply 9 according to the temperature of the electrostatic chuck detected by the temperature detecting unit 10. When the value of the temperature of the electrostatic chuck 4 detected by the temperature detecting unit 10 is higher than the preset value, the controller 11 lowers the voltage impressed by the power supply 9 from the preset value and when the value of the temperature of the electrostatic chuck 4 is lower than the preset value, the controller 11 raises the impressed voltage from the preset value, whereby the attracting force of the electrostatic chuck 4 can be kept irrespective of temperature change of the electrostatic chuck 4.

12 Claims, 9 Drawing Sheets

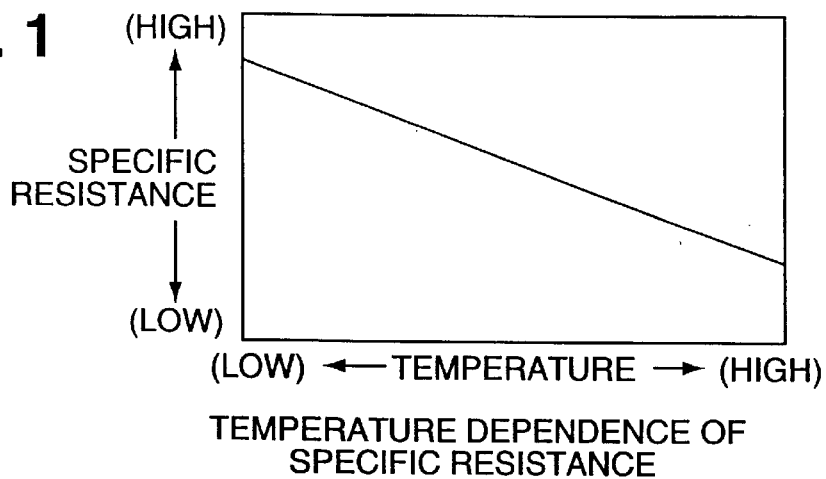
TEMPERATURE DEPENDENCE OF SPECIFIC RESISTANCE
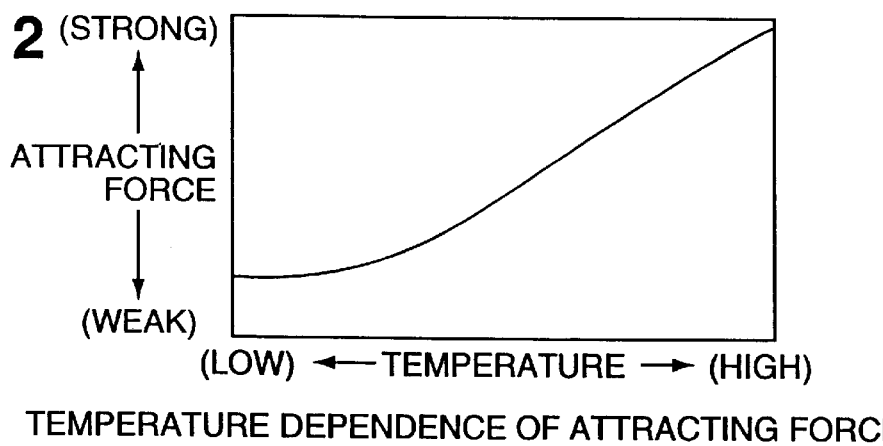
TEMPERATURE DEPENDENCE OF ATTRACTING FORCE
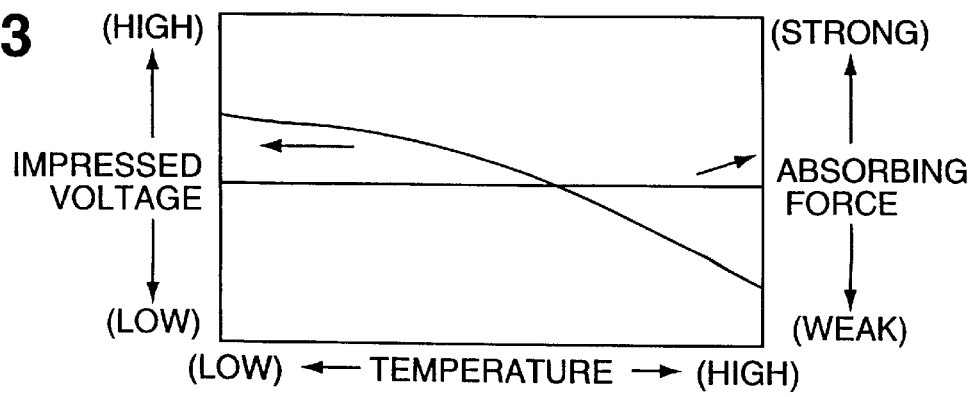
RELATIONSHIPS AMONG TEMPERATURE, IMPRESSED VOLTAGE AND ATTRACTING FORCE

RELATIONSHIP BETWEEN PROCESS TIME
AND TEMPERATURE

RELATIONSHIP BETWEEN PROCESS TIME
AND ATTRACTING FORCE

RELATIONSHIPS AMONG PROCESS TIME,
IMPRESSED VOLTAGE AND ATTRACTING FORCE

REVERSE VOLTAGE IMPRESSION

REVERSE VOLTAGE IMPRESSION

ELECTROSTATIC CHUCKING DEVICE

CROSS REFERENCE TO RELATED APPLICATIONS

This application is a division of U.S. Ser. No. 08/879,221, filed Jun. 19, 1997, which issued as U.S. Pat. No. 6,084,763 on Jun. 4, 2000.

BACKGROUND OF THE INVENTION

1. Field of the Invention

This invention relates to a method of holding a wafer on an electrostatic chuck, a method of removing a wafer from an electrostatic chuck and an electrostatic chucking device which are used properly for etching systems, CVD systems, sputtering systems, etc. used widely for thin film forming and its patterning in fine processes represented by those for manufacturing semiconductor and other electronic devices.

2. Description of the Related Art

Conventionally, a semiconductor manufacturing system such as etching system, CVD system, sputtering system, etc. has been provided with an electrostatic chuck for fixing a wafer at a specified position so that the wafer can be processed in the manufacturing system. Such electrostatic chuck comprises a dielectric body formed by an insulator, and an electrode formed by a conductor for causing dielectric polarization in the dielectric body. The electrode is connected to a high voltage DC power supply. When a DC voltage is impressed to the electrode by this high voltage DC power supply, the dielectric body is dielectrically polarized, with which the dielectric body exhibits an attracting force. In other words, this electrostatic chuck can attract and hold the wafer on its dielectric body by the attracting force provided by impressing the DC voltage.

When removing the wafer from the electrostatic chuck after a desired processing, a voltage with reverse polarity is impressed to the electrostatic chuck so as to discharge the electric charge accumulated on the electrostatic chuck. Or the wafer is exposed to plasma to discharge the electric charge accumulated on the wafer.

When various plasma processings are carried out using such an electrostatic chuck, the temperature of the electrostatic chuck rises usually due to generated plasma. Furthermore, as in the case of an etching process, where a series of processings are carried out in a plurality of steps, the temperature of the wafer must be changed significantly between steps, and accordingly the temperature of the electrostatic chuck must also be changed significantly sometimes.

If the temperature of the electrostatic chuck is thus changed significantly during a processing, however, the following problem arises.

As a material for the dielectric body of the electrostatic chuck polyimide or ceramics is generally used, but polyimide is not suitable for use in high temperature. Thus, ceramics is usually used in processings at high temperatures such as plasma processing. As for ceramics, its specific resistance becomes low when the processing temperature is high as shown in FIG. 1. When the processing temperature goes low, its specific resistance increases. The specific resistance changes such way according to the processing temperature, and accordingly the attracting force of the electrostatic chuck also changes according to the processing temperature. When the processing temperature goes high, therefore, the attracting force becomes strong and when the processing temperature goes low, the attracting force becomes weak as shown in FIG. 2.

Consequently, when the temperature of the electrostatic chuck changes to which a fixed voltage is impressed constantly, the attracting force of the electrostatic chuck, that is, the wafer holding force of the electrostatic chuck also changes. If the wafer holding force is reduced at this time, problems such as wafer displacement may occur, and accordingly the processing may be failed. When the wafer holding force increases, the wafer becomes unremovable from the electrostatic chuck sometimes when it must be removed.

OBJECT AND SUMMARY OF THE INVENTION

Under such the circumstances, it is an object of this invention to provide a method for holding wafer on the electrostatic chuck, a method for removing wafer from the electrostatic chuck and an electrostatic chucking device that can prevent the problems associated with wafer holding or wafer removed caused by temperature changes of the electrostatic chuck in processes accompanied by temperature changes.

As a result of earnest studies to achieve the above object, the inventor has reached to an idea that the electrostatic chuck can provide a constant attracting force regardless of processing temperatures if the impressed voltage to the electrostatic chuck is changed with the change in its temperature as shown in FIG. 3. Furthermore, the inventor has also reached an idea that the wafer can be removed from the electrostatic chuck without failure regardless of processing temperatures if, when a voltage of reverse polarity is impressed to the electrostatic chuck or the wafer is exposed to plasma so as to discharge the electric charge on the electrostatic chuck or the wafer, the value of the impressed voltage of reversed polarity, the voltage impression time, and the plasma exposure time are controlled according to the temperature of the electrostatic chuck. According to such ideas, the inventor has advanced the studies to complete this invention.

In other words, a method of holding a wafer on an electrostatic chuck according to the first aspect of this invention solves the problem by comprising the steps of:

setting the wafer on the electrostatic chuck;

impressing a DC voltage on the electrostatic chuck to provide the electrostatic chuck with an attracting force;

detecting a temperature of the electrostatic chuck; and controlling the attracting force constant by changing a value of the DC voltage according to the temperature of the electrostatic chuck having been detected;

The problem can be also solved by an electrostatic chucking device which carries out the above method by comprising:

an electrostatic chuck attracting and holding a wafer thereon;

a temperature detecting unit for detecting a temperature of the electrostatic Chuck;

a power supply connected to the electrostatic chuck, which impresses a DC voltage on the electrostatic chuck to provide the electrostatic chuck with an attracting force; and a controller for controlling the attracting force constant by changing a value of the DC voltage according to the temperature of the electrostatic chuck having been detected.

In the above method and the electrostatic chucking device, the value of the DC voltage can be controlled so that it is lowered from a preset value when the temperature of the electrostatic chuck is detected to become higher than a preset temperature and is raised from the preset value when the temperature of the electrostatic chuck is detected to become lower than the preset temperature.

Thus, according to the above method and the electrostatic chucking device, the attracting force of the electrostatic chuck for attracting and holding the wafer can be kept constant regardless of temperature changes of the electrostatic chuck.

The problem can be also solved by a method of removing a wafer from an electrostatic chuck according to the second aspect of this invention wherein the wafer is attracted and held by impressing a DC voltage on the electrostatic chuck and is removed by impressing a reverse voltage with polarity reverse to that of the DC voltage on the electrostatic chuck, and the method comprises the steps of:

detecting a temperature of the electrostatic chuck;

defining a value of the reverse voltage according to the temperature of the electrostatic chuck having been detected;

reversing polarity of the DC voltage impressed on the electrostatic chuck;

impressing the reverse voltage on the electrostatic chuck with the value of the reverse voltage having been defined; and removing the wafer from the electrostatic chuck.

The problem can be also solved by an electrostatic chucking device which carries out the above method according to the second aspect of this invention by comprising:

an electrostatic chuck attracting and holding a wafer thereon;

a temperature detecting unit for detecting a temperature of the electrostatic chuck;

a power supply connected to the electrostatic chuck, the power supply impressing a DC voltage on the electrostatic chuck to provide the electrostatic chuck with an attracting force;

a reversing unit for reversing a polarity of the DC voltage impressed on the electrostatic chuck to supply the DC voltage as a revere voltage; and a reverse voltage defining unit for defining a value of said reverse voltage according to the temperature of the electrostatic chuck having been detected, when the polarity of the DC voltage is reverse.

In the above method and the electrostatic chucking device, when the wafer is removed from the electrostatic chuck, a value of the reverse voltage can be defined so that the absolute value of the reverse voltage is increased to be larger than a preset value when the temperature of the electrostatic chuck is detected to be higher than a preset temperature, and is reduced to be smaller than the preset value when the temperature of the electrostatic chuck is detected to be lower than the preset temperature.

Thus, according to the above method and the electrostatic chucking device, the electric charge on the electrostatic chuck corresponding to the attracting force for holding the wafer can be well eliminated by impressing the reverse voltage on the electrostatic chuck with the value having been defined.

The problem can be also solved by a method of removing a wafer from an electrostatic chuck according to the third aspect of this invention wherein the wafer is attracted and held by impressing a DC voltage on the electrostatic chuck and is removed by impressing a reverse voltage on the electrostatic chuck with polarity reverse to that of the DC voltage, and the method comprises the steps of:

detecting a temperature of the electrostatic chuck;

defining an impression time of the reverse voltage according to the temperature of the electrostatic chuck having been detected;

reversing a polarity of the DC voltage impressed on the electrostatic chuck;

impressing the reverse voltage on the electrostatic chuck for the impression time having been defined according to the temperature of the electrostatic chuck having been detected; and removing the wafer from the electrostatic chuck.

The problem can be also solved by an electrostatic chucking device which carries out the above method according to the third aspect of this invention by comprising:

an electrostatic chuck attracting and holding a wafer thereon;

a temperature detecting unit for detecting a temperature of the electrostatic chuck;

a power supply connected to the electrostatic chuck, the power supply impressing a DC voltage on the electrostatic chuck to provide the electrostatic chuck with an attracting force; and a reversing unit for reversing a polarity of the DC voltage impressed on the electrostatic chuck to supply the DC voltage as reverse voltage; and an impression time defining unit for defining an impression time of the reverse voltage according to the temperature of the electrostatic chuck having been detected, when the polarity of the DC voltage is reversed.

In the above method and the electrostatic chucking device, when the wafer is removed from the electrostatic chuck, the impression time of the reverse voltage can be defined so that it is extended to be larger than a preset time when the temperature of the electrostatic chuck is detected to be higher than a preset temperature, and is shortened to be smaller than the preset time when the temperature of the electrostatic chuck is detected to be lower than a preset temperature.

Thus, according to the above method and the electrostatic chucking device, the electric charge on the electrostatic chuck corresponding to the attracting force for holding the wafer can be well eliminated by impressing the reverse voltage on the electrostatic chuck for the impression time having been defined according to the temperature of the electrostatic chuck having been detected.

The problem can be also solved by a method of removing a wafer from an electrostatic chuck according to the fourth aspect of this invention wherein the wafer attracted and held on the electrostatic chuck is removed by exposing the electrostatic chuck to plasma, and the method comprised the steps of:

detecting a temperature of the electrostatic chuck;

defining a time of exposure to plasma according to the temperature of the electrostatic chuck having been detected;

exposing the electrostatic chuck to the plasma for the time of exposure to plasma having been defined according to the temperature of the electrostatic chuck having been detected; and removing the wafer from the electrostatic chuck.

The problem can be also solved by an electrostatic chucking device which carries out the above method according to the fourth aspect of this invention by comprising:

an electrostatic chuck attracting and holding a wafer thereon;

a temperature detecting unit for detecting a temperature of the electrostatic chuck;

a power supply connected to the electrostatic chuck, the power supply impressing a DC voltage on the electrostatic chuck to provide the electrostatic chuck with an attracting force;

an exposure-to-plasma unit for exposing the electrostatic chuck to plasma; and a plasma defining unit for defining a time of exposure to plasma according to the temperature of said electrostatic chuck having been detected.

In the above method and the electrostatic chucking device, when the wafer is removed from the electrostatic chuck, the time of exposure to plasma can be defined so that it is extended to be larger than a preset time when the temperature of the electrostatic chuck is detected to be higher than a preset temperature and is shortened to be smaller than the preset time when the temperature of the electrostatic chuck is detected to be lower than the preset temperature.

Thus, according to the above method and the electrostatic chucking device, the electric charge on the electrostatic chuck corresponding to the attracting force for holding the wafer can be well eliminated by exposing the electrostatic chuck to the plasma for the time of exposure to plasma having been defined according to the temperature of the electrostatic chuck having been detected.

The problem can be also solved by a method of removing a wafer from an electrostatic chuck according to the fifth aspect of this invention wherein the wafer is attracted and held by impressing a DC voltage on the chuck and is removed by impressing a reverse voltage with polarity reverse to that of the DC voltage and exposing the wafer on the electrostatic chuck to plasma, and the method comprises the steps of:

detecting a temperature of the electrostatic chuck;

defining an impression time of the reverse voltage according to the temperature of the electrostatic chuck having been detected;

defining a time of exposure to plasma according to the temperature of the electrostatic chuck having been detected;

reversing polarity of the DC voltage on the electrostatic chuck;

impressing the reverse voltage on the electrostatic chuck for the impression time having been defined according to the temperature of the electrostatic chuck having been detected;

exposing the wafer on the electrostatic chuck to the plasma for the time of exposure to plasma having been defined according to the temperature of the electrostatic chuck having been detected; and removing the wafer from the electrostatic chuck.

The above problem can be also solved by an electrostatic chucking device which carries out the above method according to the fifth aspect of this invention, for which the electrostatic chucking device carrying out the method according to the fourth aspect of this invention is modified so that the device further comprises:

a reversing unit for reversing a polarity of the DC voltage impressed on the electrostatic chuck to supply said DC voltage as a reverse voltage; and an impression time defining unit for defining an impression time of said reverse voltage according to said temperature of said electrostatic chuck having been detected, when the polarity of said DC voltage is reversed.

Thus, according to the above method and the electrostatic chucking device, the electric charge on the electrostatic chuck corresponding to the attracting force for holding the wafer can be well eliminated by impressing the reverse voltage on the electrostatic chuck for the impression time having been defined according to the temperature of the electrostatic chuck having been detected, in addition to exposing the wafer on the electrostatic chuck to the plasma for the time of exposure to plasma having been defined according to the temperature of the electrostatic chuck having been detected.

The above method of removing a wafer from an electrostatic chuck according to the fifth aspect of this invention can be modified so as to comprise the step of defining a value of the reverse voltage according to the temperature of the electrostatic chuck having been detected, instead of the step of defining an impression time of the reverse voltage.

Similarly, the above electrostatic chucking device carrying out the above method according to the fifth aspect of this invention can be modified to carry out the above modified method by comprising a reverse voltage defining unit for defining a value of the reverse voltage according to the temperature of the electrostatic chuck having been detected, when the polarity of said DC voltage is reversed, instead of the impression time defining unit.

Thus, according to the above method and the electrostatic chucking device, the electric charge on the electrostatic chuck corresponding to the attracting force for holding the wafer can be well eliminated by impressing the reverse voltage on the electrostatic chuck with the value of the reverse voltage having been defined according to the temperature of the electrostatic chuck having been detected, in addition to exposing the wafer on the electrostatic chuck to the plasma for the time of exposure to plasma having been defined according to the temperature of the electrostatic chuck having been detected.

BRIEF DESCRIPTION OF THE DRAWINGS

FIG. 1 is a graph showing general temperature dependence of specific resistance of a ceramic.

FIG. 2 is a graph showing general temperature dependence of attracting force of an electrostatic chuck.

FIG. 3 is a graph showing experimentally obtained relationships of impressed voltage and attracting force of an electrostatic chuck to electrostatic chuck temperature.

DETAILED DESCRIPTION OF THE PREFERRED EMBODIMENTS

Hereunder, this invention will be explained in detail.

Figure 4:
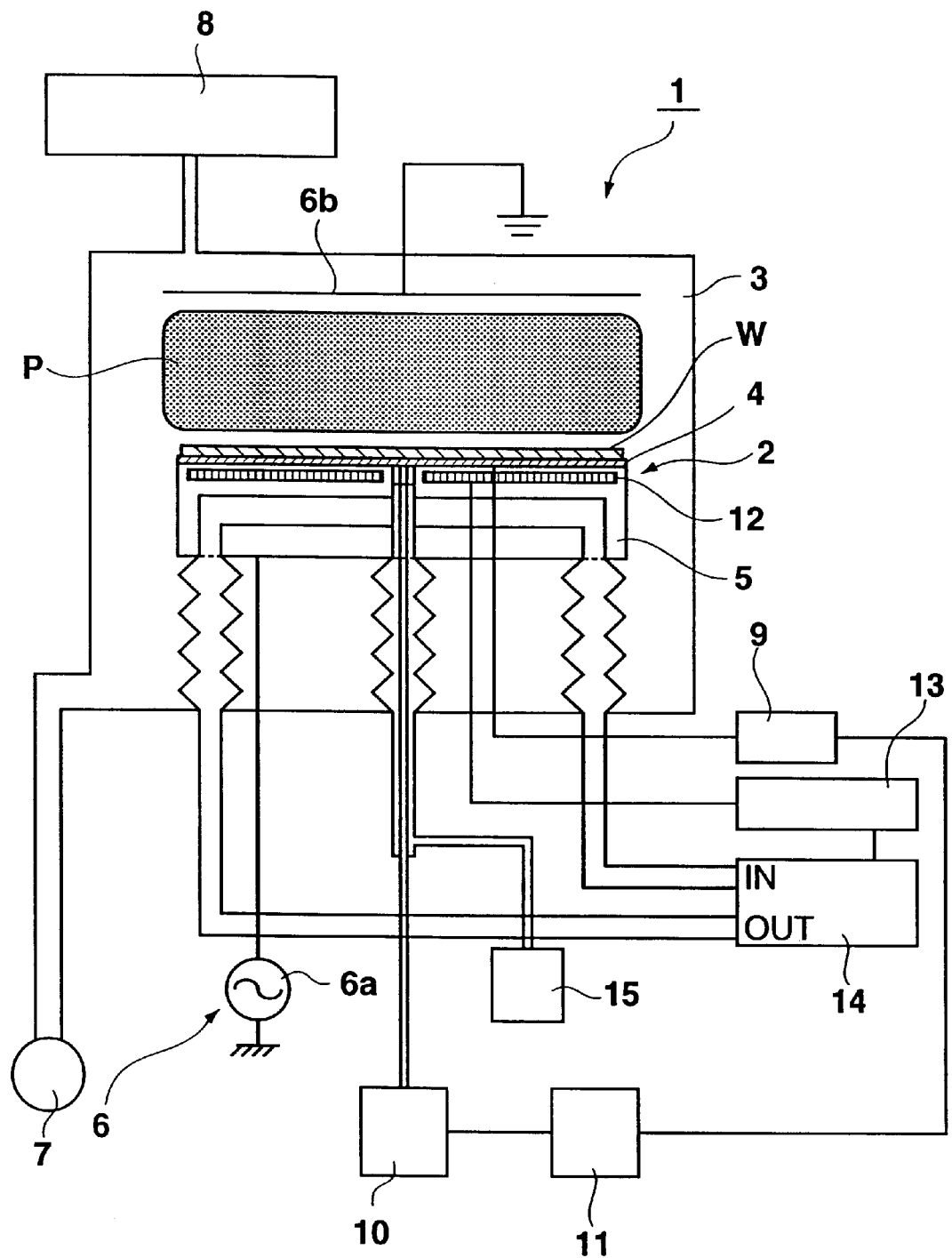
FIG. 4 is a schematic illustration showing a plasma processing system using an electrostatic chucking device according to the first embodiment of this invention.

FIG. 4 shows a plasma processing system 1 using an electrostatic chucking device 2 according to the first embodiment of this invention by which a method of holding a wafer according to the first aspect of this invention can be carried out.

The plasma processing system 1 is provided with a vacuum chamber 3; the above-mentioned electrostatic chucking device 2 arranged in the vacuum chamber 3; and a cooling jacket 5 used to fix an electrostatic chuck 4 of this electrostatic chucking device 2. The plasma processing system 1 generates plasma P to process the wafer W put on the electrostatic chuck 4 by using an exposure-to-plasma means 6 comprising a high frequency generator 6a and an electrode plate 6b, both arranged outside the vacuum chamber 3. The vacuum chamber 3 is connected to a vacuum pump 7 and a process gas flow controller 8, with which the gas pressure in the vacuum chamber 3 can be adjusted to a value that enables electric discharge so that a plasma processing as specified can be carried out.

The electrostatic chucking device 2 comprises the electrostatic chuck 4, a high voltage DC power supply 9, a temperature detecting unit as temperature detecting means 10 and a controller 11 as control means. Like the related art, this electrostatic chuck 4 is provided with a dielectric body (not illustrated) formed by an insulator and an electrode (not illustrated) formed by a conductor for inducing dielectric polarization in the dielectric body. The electrode is connected to the high voltage DC power supply 9 so that a DC voltage can be impressed on the electrode directly from this high voltage DC power supply 9 to provide the electrode with an attracting force. This electrostatic chuck 4 is also connected to the temperature detecting unit 10 used to detect the temperature of the electrostatic chuck 4. This temperature detecting unit 10 comprises an optical fiber temperature sensor and detects the temperature of the electrostatic chuck 4. The detected value is outputted to the controller 11.

The controller 11 controls the voltage impressed on the electrode by the high voltage DC power supply 9 on the basis of the detected temperature and changes the attracting force of the electrostatic chuck for the wafer W.

The cooling jacket 5 is provided with a ceramic heater 12 on its top, that is, on the side of the electrostatic chuck 4. This ceramic heater 12 heats the electrostatic chuck 4 to heat the wafer W held on the electrostatic chuck 4 indirectly. This ceramic heater 12 is connected to a temperature controller 13 used to adjust the degree of heating the wafer W. The cooling jacket 5 is connected to a cooling device 14 used to cool down the cooling jacket 5 by circulating such a coolant as He (helium) gas, and the like. This cooling device 14 is connected to the cooling jacket 5 with a pipe to supply the coolant to the cooling jacket 5 and a pipe to return the coolant to the cooling device 14 from the cooling jacket 5. Each pipe is provided with a coolant flow controller 15. The coolant flow controller 15 is made up of such components as electronically controlled valves, etc. and is used to adjust the flow rate of the coolant supplied from the cooling device 14 to the cooling jacket 5, so that the temperature of the cooling jacket 5 is adjusted.

Next, an example of the method of holding the wafer on the electrostatic chuck according to the first aspect of this invention will be explained which is carried out with the electrostatic chucking device 2 according to the first embodiment of this invention in the plasma processing system 1.

At first, the wafer W is put on the electrostatic chuck 4 of the electrostatic chucking device 2, then the vacuum pump 7 is started in this state to exhaust the vacuum chamber 3.

After this, the temperature controller 13 is operated so that the temperature of the electrostatic chuck 4 is set at the specified temperature, the ceramic heater 8 is then energized and the cooling device 14 is started to circulate the coolant. With this, the temperature of the wafer W on the electrostatic chuck 4 is adjusted to be at a required temperature suited for plasma processing, for example, at 25° C.

Subsequently, the process gas flow controller 8 is operated to adjust the pressure in the vacuum chamber 3 so as to enable electric discharging. In this state, plasma P is generated in the vacuum chamber 3 by means of the high frequency generator 6a and the electrode plate 6b. Then, a required voltage, for example, DC500V is impressed on the electrode (not illustrated) of the electrostatic chuck 4 by the high voltage DC power supply 9 of the electrostatic chucking device 2, so that the electrostatic chuck 2 can exhibit attracting force and securely hold the wafer W thereon.

When the wafer W is thus secured on the electrostatic chuck 4, the process gas flow controller 8 is started to supply the process gas into the vacuum chamber 3 for carrying out a desired plasma processing. At this time, the electrostatic chuck 4 securely holding the wafer W is heated by the plasma P and its temperature rises significantly up to about, for example, 200° C. In this invention, therefore, the temperature rising (change) of this electrostatic chuck 4 is continuously detected by the temperature detecting unit 10. If the detected temperature of the electrostatic chuck 4 becomes higher than the preset one, for example, rises up to 200° C., the controller 11 controls the high voltage DC power supply 9 to lower the impressed voltage from the specified voltage (500V) down to, for example, 150V. On the other hand, if the temperature of the electrostatic chuck 4 becomes lower than the preset one due to change in processing condition, the controller 11 controls the high voltage DC power supply 9 to raise the impressed voltage up to the specified voltage (500V).

As the preset temperature of the electrostatic chuck 4 at this time, is adopted the temperature which is set, for example, when the high DC voltage is initially impressed on the electrostatic chuck 4 so that it exhibits an attracting force enough to secure the wafer W (25° C. in this embodiment). As explained above, when the temperature of the electrostatic chuck 4 changes during the plasma processing, the voltage impressed on the electrostatic chuck 4 is also changed. Hence, regardless of temperature changes of the electrostatic chuck 4, it is possible to keep the preset attracting and holding force of the electrostatic chuck 4, that is, the attracting and holding force obtained by impressing the high DC voltage determined according to the initially set temperature of the electrostatic chuck 4.

Consequently, in the method of holding the wafer carried out in this electrostatic chucking device 2, the wafer W can be attracted and held on the electrostatic chuck 4 with a constant force regardless of the temperature changes of the electrostatic chuck 4. This avoids such problem that the wafer W is displaced from the specified position due to a reduced wafer holding force, or becomes unremovable due to an increased wafer holding force when it must be removed.

Figure 5:
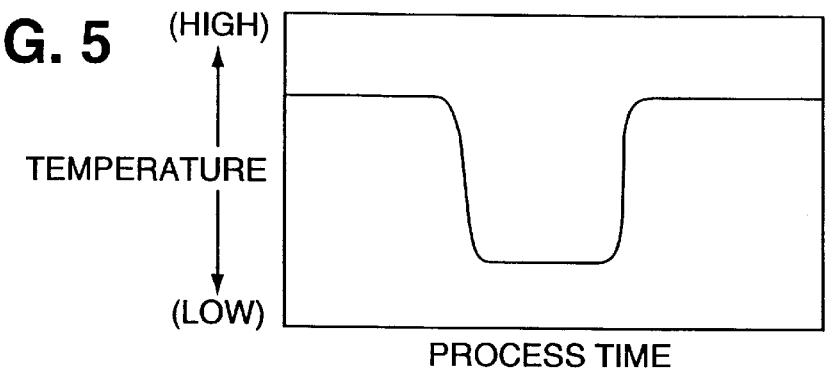
FIG. 5 is a graph showing a relationship between process time and temperature of an electrostatic chuck.

Furthermore, a plasma processing system 1 provided with such electrostatic chucking device 2 is suitable for a series of processings such as etching which is carried out in a plurality of steps, wherein the temperature of the electrostatic chuck 4, that is, the wafer processing temperature is changed significantly between steps as shown in FIG. 5.

Figure 6:
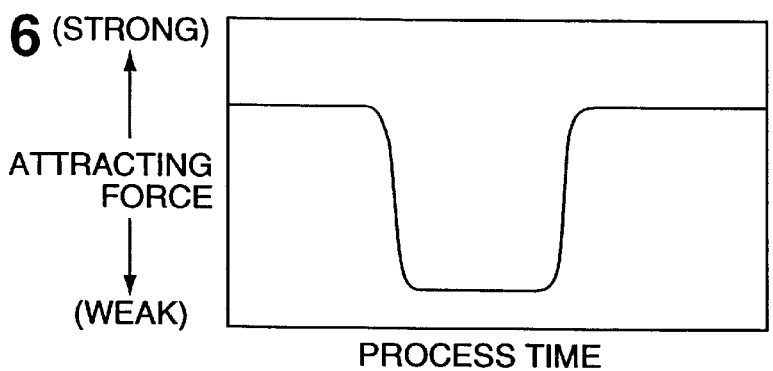
FIG. 6 is a graph showing a relationship between process time and attracting force of an electrostatic chuck.

In other words, in the related art plasma processing system in which an impressed voltage is not changed with a change in the temperature of the electrostatic chuck 4, the attracting force of the electrostatic chuck 4 changes significantly as shown in FIG. 6 when the temperature changes as shown in FIG. 5 to cause the above mentioned problems.

Figure 7:
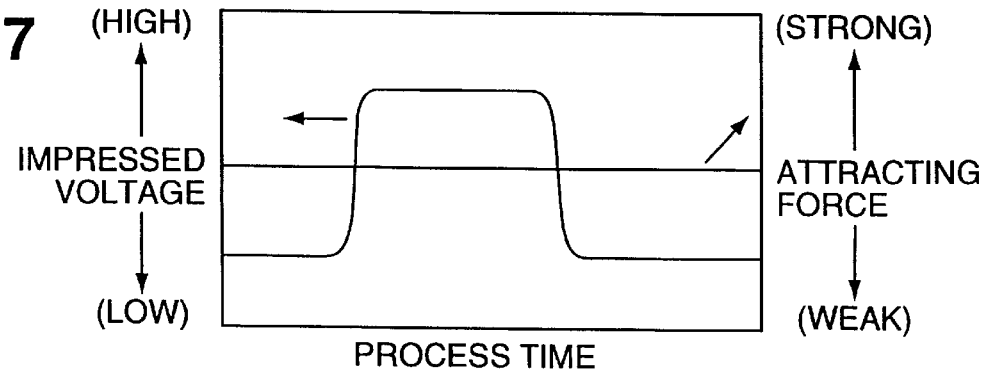
FIG. 7 is a graph showing the relationships of the impression time and attracting force of the electrostatic chuck to the process time in the electrostatic chucking device according to the first embodiment of this invention used in the plasma processing system shown in FIG. 4.

Contrary to this, in the plasma processing system 1 provided with the electrostatic chucking device 2, the impressed voltage is changed as shown in FIG. 4 as the change in the temperature of the electrostatic chuck 4, so that the attracting force of the electrostatic chuck 4 can be kept constant as shown in FIG. 7.

Figure 8:
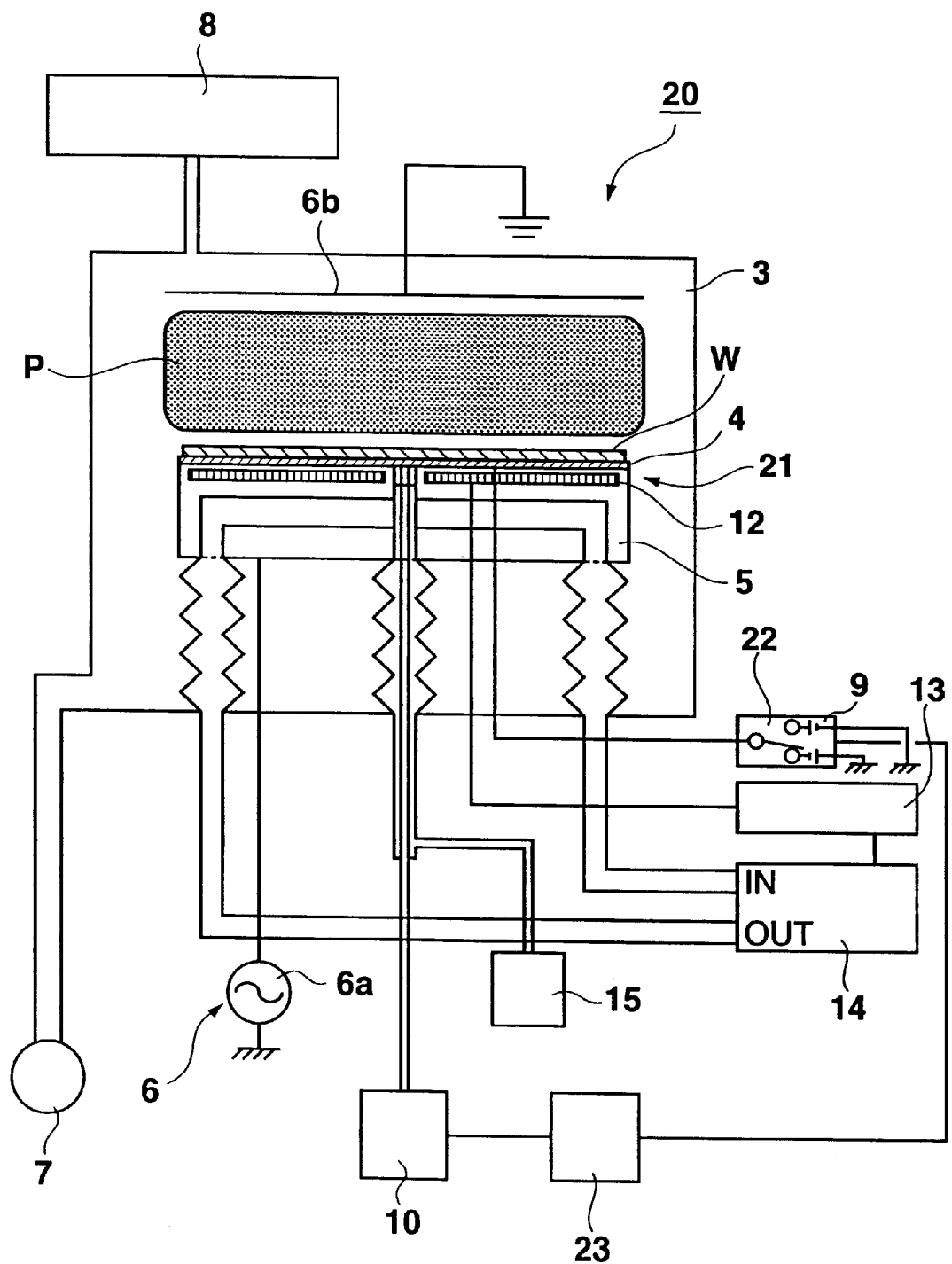
FIG. 8 is a schematic illustration showing a plasma processing system using an electrostatic chucking device according to the second embodiment of this invention.

FIG. 8 shows a plasma processing system 20 provided with an electrostatic chucking device 21 according to the second embodiment of this invention by which a method of removing a wafer according to the second aspect of this invention can be carried out. The electrostatic chucking device 21 differs from the electrostatic chucking device 2 shown in FIG. 4 in that the high voltage DC power supply 9 is provided with a reversing unit 22 as reversing means instead of the controller 11 for reversing the polarity of the impressed voltage and a reverse voltage defining unit 23 as reverse voltage defining means for defining the value of a reverse voltage that is impressed after the reversing unit 22 has reversed the polarity. In other words, unlike the electrostatic chucking device 2 shown in FIG. 4 whose object is to keep the attracting force of the electrostatic chuck 4 constant, the object of this electrostatic chucking device 21 is to prevent a problem that the wafer W becomes unremovable from the electrostatic chuck 4 due to a change in the attracting force caused by a temperature change of the electrostatic chuck 4 when the wafer W must be removed from the electrostatic chuck 4.

The reversing unit 22 is connected to an unillustrated processing controller, etc. of the plasma processing system 20. When a plasma processing ends, the unit 22 reverse the polarity of the impressed voltage supplied from the high voltage DC power supply 9 automatically or manually.

Figure 9:
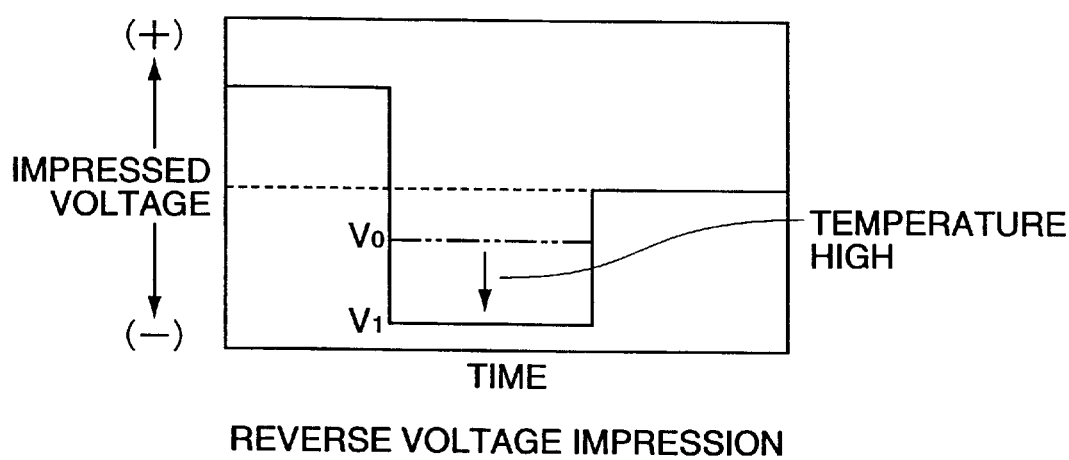
FIG. 9 is a graph explaining how to impress an inverted voltage in the electrostatic chucking device used in the plasma processing system shown in FIG. 8.

The reverse voltage defining unit 23 defines the value of a reverse voltage impressed after the reversing unit 22 has reversed the polarity according to the temperature of the electrostatic chuck 4 detected by the temperature detecting unit 10 when the polarity of the impressed voltage is reversed. In other words, this reverse voltage defining unit 23 increases the absolute value V1 of the reverse voltage to be higher than the preset value V0 when the temperature of the electrostatic chuck 4 detected by the temperature detecting unit 10 is higher than the preset temperature as shown in FIG. 9. When the temperature of the electrostatic chuck 4 is lower than the preset temperature, this reverse voltage defining unit 23 reduces the absolute value of the reverse voltage to be lower than the preset value.

As the temperature of the electrostatic chuck 4 to be preset at this time, like in the previous embodiment, is adopted the temperature which is set, for example, when the high DC voltage initially impressed on the electrostatic chuck 4 so that it exhibits an attracting force enough to secure the wafer W. As the value V0 of the preset voltage to be impressed after the polarity is reversed, is adopted a voltage value that can discharge the electric charge accumulated on the electrostatic chuck 4 within the specified time at the above set temperature. As the specified time mentioned above, a time preset in a series of processes for the plasma processing is adopted.

Next, an example of the method of removing the wafer from the electrostatic chuck according to the second aspect of this invention will be explained which is carried out with the electrostatic chucking device 21 according to the second embodiment of this invention in the plasma processing system 20.

At first, like in the previous example, a plasma processing is carried out with the wafer W being secured on the electrostatic chuck 4. During this processing, however, the specified voltage is constantly impressed on the electrostatic chuck 4 without being changed.

After such a plasma processing ends, the reversing unit 22 reverses the polarity of the impressed voltage on the electrostatic chuck 4 to discharge the electric charge accumulated on the electrostatic chuck 4. At this time, the value of the reverse voltage is defined by the reverse voltage defining unit 23 according to the temperature of the electrostatic chuck 4 detected by the temperature detecting unit 10 in advance. In other words, the impressed reverse voltage value (absolute value) is defined so that the reverse voltage can offset the electric charge accumulated on the electrostatic chuck 4 by the amount changed due to the change in temperature of the electrostatic chuck 4.

By impressing thus defined reverse voltage on the electrostatic chuck 4, the electric charge accumulated on the electrostatic chuck 4 is discharged surely, with which the problem that the wafer W becomes unremovable from the electrostatic chuck 4 is avoided which is due to the change in the attracting force of the electrostatic chuck 4 caused by temperature change of the electrostatic chuck 4.

Consequently, in this method of removing the wafer W from the electrostatic chuck 4 carried out in this electrostatic chucking device 21, the electric charge can be eliminated from the electrostatic chuck 4 the amount of which corresponds to the attracting force of the electrostatic chuck 4 when holding the wafer. As a result, the problem that the wafer W becomes unremovable from the electrostatic chuck 4 is avoided and the plasma processing can be carried out stably.

Figure 10:
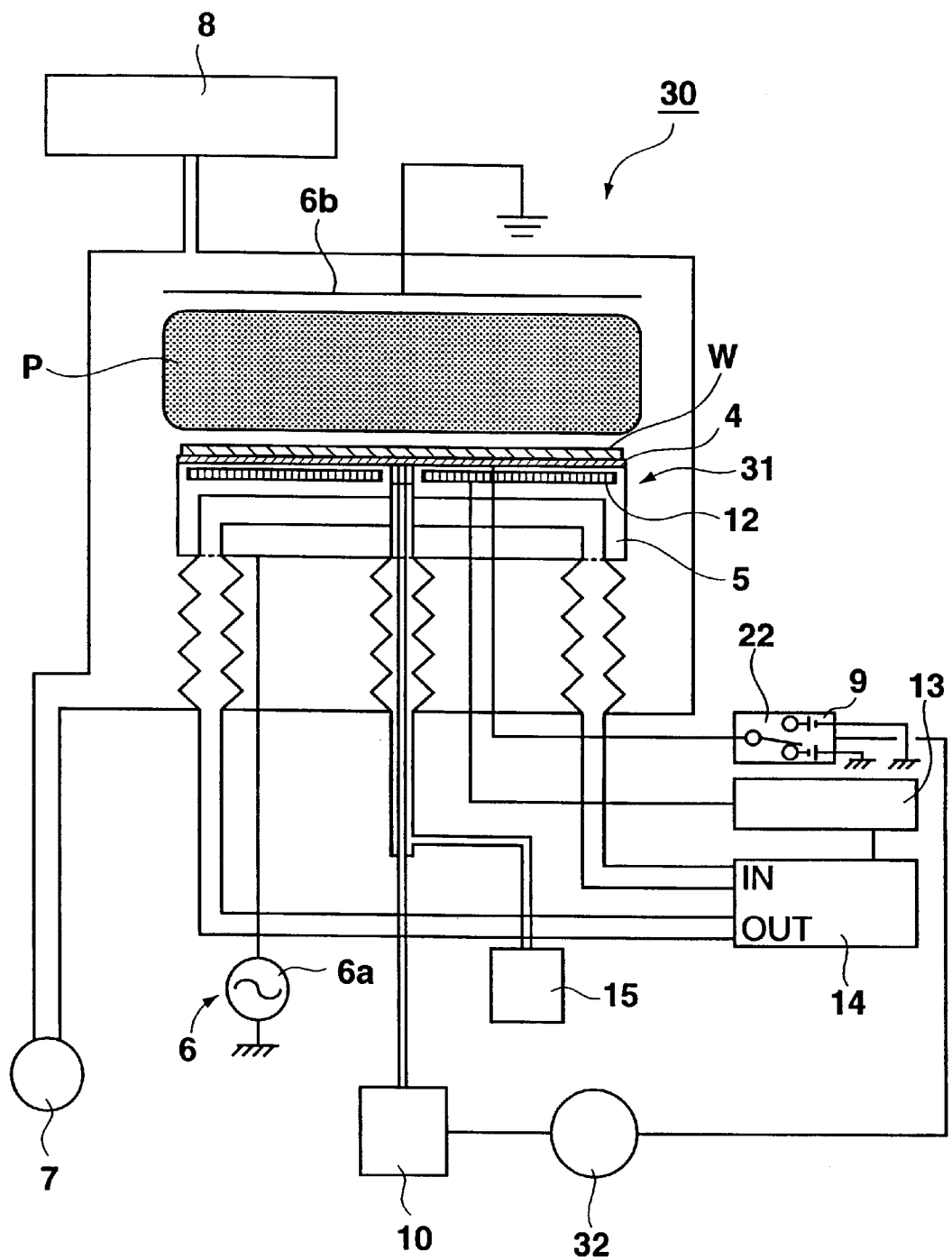
FIG. 10 is a schematic illustration showing a plasma processing system using an electrostatic chucking device according to the third embodiment of this invention.

FIG. 10 shows a plasma processing system 30 provided with an electrostatic chucking device 31 according to the third embodiment of this invention by which a method of removing a wafer according to the third aspect of this invention can be carried out. This electrostatic chucking device 31 differs from the electrostatic chucking device 21 shown in FIG. 8 in that the electrostatic chucking device 31 is provided with a time defining unit 32 as impression time defining means instead of the reverse voltage defining unit 23 for defining an impression time of the reverse voltage after the reversing unit 22 has reversed the polarity. In other words, like the electrostatic chucking device 21 shown in FIG. 8, this electrostatic chucking device 31 is also used to avoid the problem that the wafer W becomes unremovable from the electrostatic chuck 4 due to change in the attracting force caused by a temperature change of the electrostatic chuck 4 when the wafer W must be removed from the electrostatic chuck 4.

Figure 11:
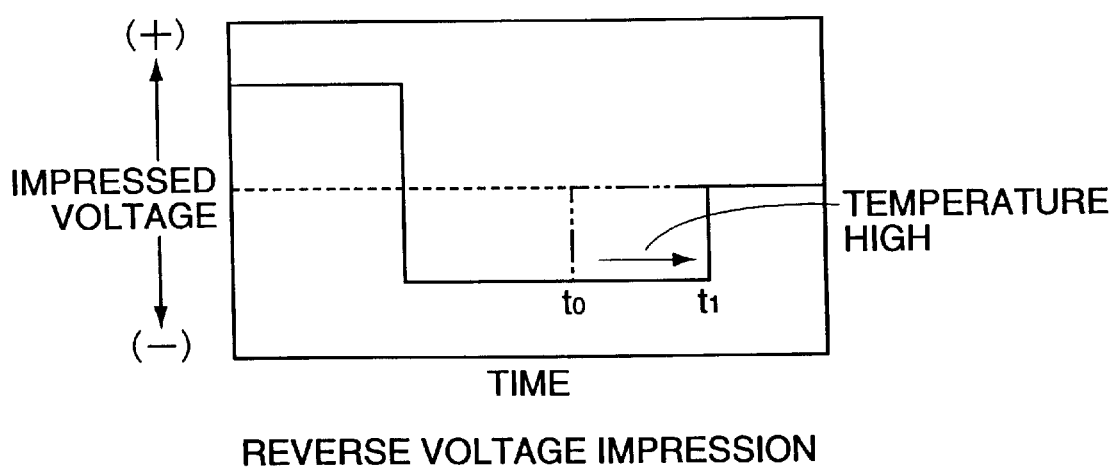
FIG. 11 is a graph explaining how to impress an inverted voltage in the electrostatic chucking device used in the plasma processing system shown in FIG. 10.

The time defining unit 32 defines an impression time of the reverse voltage to be impressed after the reversing unit 22 has reversed the polarity according to the temperature of the electrostatic chuck 4 detected by the temperature detecting unit 10 when the polarity of the impressed voltage is reversed. In other words, this time defining unit 32 extends the impression time t1 of the reversed voltage from the preset impression time t0 when the value of the temperature of the electrostatic chuck 4 detected by the temperature detecting unit 10 is higher than the preset value as shown in FIG. 11. When the value of the temperature of the electrostatic chuck 4 is lower than the preset value, this time defining unit 32 shortens the impression time from the preset value.

As the temperature of the electrostatic chuck 4 to be preset at this time, like in the previous embodiments, is adopted the temperature which is set, for example, when the high DC voltage is initially impressed on the electrostatic chuck 4 so that it exhibits an attracting force enough to secure the wafer W. As the value t0 of the preset impression time for the reverse voltage after the polarity is reversed, is adopted a time value within which the accumulated charge on the electrostatic chuck 4 can be discharged by impressing the specified reverse voltage at the above set temperature. As the specified reverse voltage mentioned above, is adopted a reverse voltage whose absolute value is, for example, the same as that of the voltage impressed on the electrostatic chuck 4 to secure the wafer W during plasma processing.

Next, an example of the method of removing the wafer from the electrostatic chuck according to the third aspect of this invention will be explained which is carried out with the electrostatic chucking device 31 according to the third embodiment of this invention in the plasma processing system 30.

At first, like in the previous examples, a plasma processing is carried out with the wafer W being secured on the electrostatic chuck 4. During this processing, however, the specified voltage is constantly impressed to the electrostatic chuck 4 without being changed.

After such a plasma processing ends, the reversing unit 22 reverses the polarity of the impressed voltage on the electrostatic chuck 4 to discharge the electric charge accumulated on the electrostatic chuck 4. At this time, a voltage impression time of the reverse voltage is defined by the time defining device 32 according to the temperature of the electrostatic chuck 4 detected by the temperature detecting unit 10 in advance. In other words, the impression time of the reverse voltage is defined so that the reverse voltage can offset the electric charge accumulated on the electrostatic chuck 4 by the amount changed due to the change in temperature of the electrostatic chuck 4.

By impressing the reverse voltage on the electrostatic chuck 4 for thus defined time, the electric charge accumulated on the electrostatic chuck 4 is discharged surely, with which the problem that the wafer W becomes unremovable from the electrostatic chuck 4 is avoided which is due to the change in the attracting force of the electrostatic chuck 4 caused by temperature change of the electrostatic chuck 4.

Consequently, in this method of removing the wafer W from the electrostatic chuck 4 carried out in this electrostatic chucking device 31, the electric charge can be also discharged from the electrostatic chuck 4 the amount of which corresponds to the attracting force of the electrostatic chuck 4 when holding the wafer. As a result, the problem that the wafer W becomes unremovable from the electrostatic chuck 4 is avoided and the plasma processing can be carried out stably.

Figure 12:
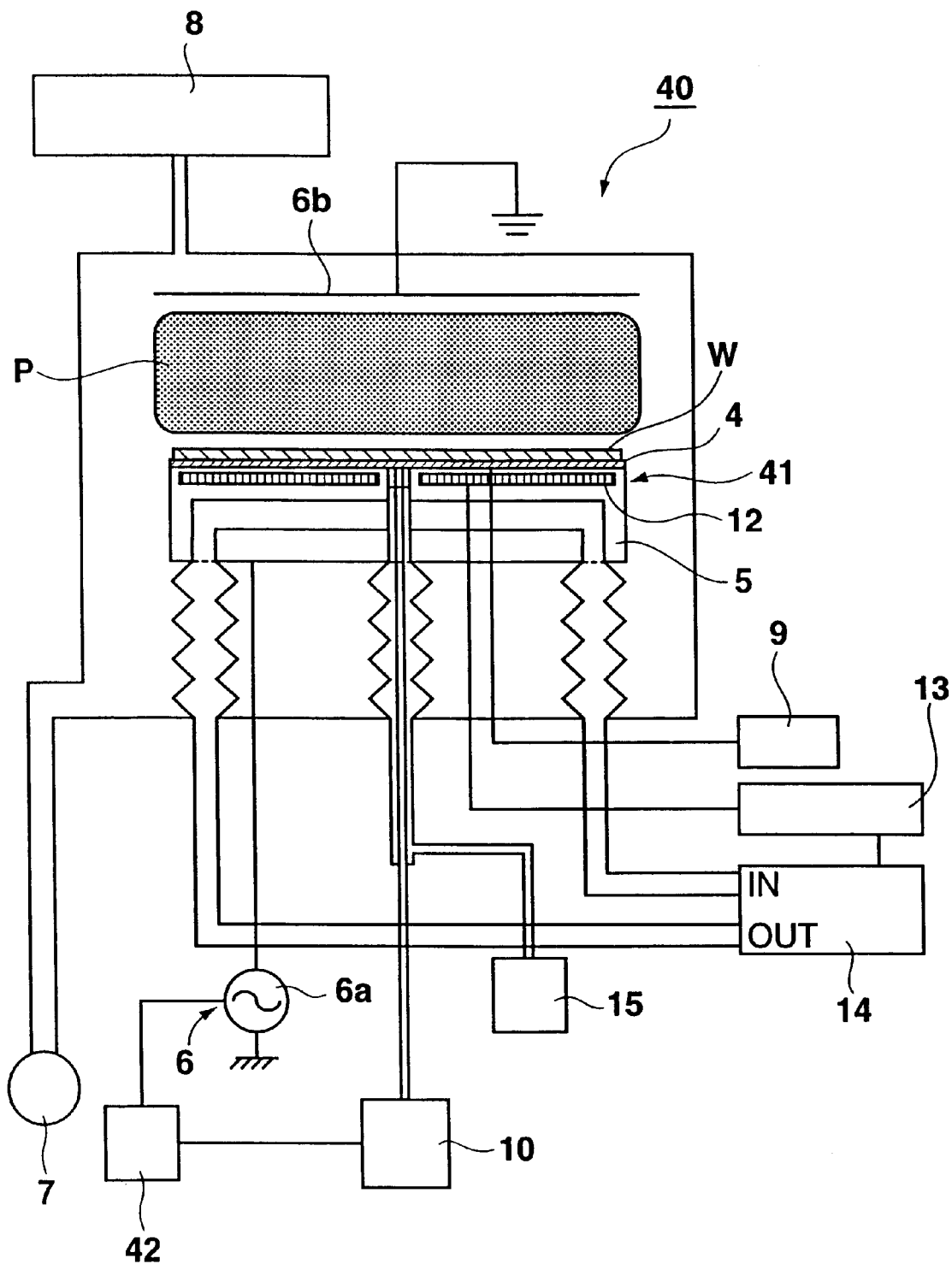
FIG. 12 is a schematic illustration showing a plasma processing system using an electrostatic chucking device according to the fourth embodiment of this invention.

FIG. 12 shows a plasma processing system 40 provided with an electrostatic chucking device 41 according to the fourth embodiment of this invention by which a method of removing a wafer according to the fourth aspect of this invention can be carried out. This electrostatic chucking device 41 differs from the electrostatic chucking device 21 shown in FIG. 8 in that the electrostatic chucking device 41 is provided with an exposure-to-plasma means 6, and both of the reversing unit 22 and the reverse voltage defining unit 23 are replaced with a plasma defining unit 42 as plasma defining means to define a time of exposure to plasma in the exposure-to-plasma means. In other words, like the electrostatic chucking device 21 shown in FIG. 8, this electrostatic chucking device 41 is also used to avoid the problem that the wafer W becomes unremovable from the electrostatic chuck 4 due to change in the attracting force caused by a temperature change of the electrostatic chuck 4 when the wafer W must be removed from the electrostatic chuck 4.

The exposure-to-plasma means 6 is the same as the exposure-to-plasma means 6 shown in FIG. 4 in configuration. This exposure-to-plasma means 6 comprises a high frequency generator 6a and an electrode plate 6b. The high frequency generation 6a is connected to the cooling jacket 5 to supply a high frequency for the cooling jacket 5. This exposure-to-plasma means 6 exposes the electrostatic chuck 4 to plasma for carrying out a desired plasma processing and, after the plasma processing, exposes the wafer W held on the electrostatic chuck 4 to plasma so as to discharge the electric charge accumulated on the wafer W. In this embodiment, the electrostatic chucking device 41 is indispensable for the plasma processing system 40, which can function as a plasma processing system only when the system is provided with the exposure-to-plasma means 6 of this electrostatic chucking device 41.

The plasma defining unit 42 defines a time of exposure to plasma from the exposure-to-plasma means 6 according to the temperature of the electrostatic chuck 4 detected by the temperature detecting unit 10 when removing the wafer W from the electrostatic chuck 4. When the value of the temperature of the electrostatic chuck 4 detected by the temperature detecting unit 10 is higher than the preset value, this plasma defining device 42 extends the time of exposure to plasma from the preset value. When the value of the temperature of the electrostatic chuck 4 is lower than the preset value, this plasma defining unit 42 shortens the time of exposure to plasma from the preset value.

As the temperature of the electrostatic chuck 4 to be preset at this time, like in the previous embodiments, is adopted the temperature which is set, for example, when the high DC voltage is initially impressed on the electrostatic chuck 4 so that it exhibits an attracting force enough to secure the wafer W. With respect to the time of exposure to plasma defined by the plasma defining device 42, the time of exposure to plasma obtained by experiments etc., that is, a time needed to discharge the electric charge accumulated on the wafer W when the temperature of the electrostatic chuck 4 matches with the preset temperature is defined as a reference time. And, when the temperature of the electrostatic chuck 4 is higher than the preset temperature, the time of exposure to plasma is set longer than the reference time. When the temperature is lower than the preset temperature, the time of exposure to plasma is set shorter than the reference time. The relationship between the temperature of the electrostatic chuck 4 and a degree of setting the time of exposure to plasma longer or shorter than the reference time are obtained in advance by experiments, etc. and saved in the plasma defining unit 42.

Next, an example of the method of removing the wafer from the electrostatic chuck according to the fourth aspect of this invention will be explained which is carried out with the electrostatic chucking device 41 according to the fourth embodiment of this invention in the plasma processing system 40.

At first, like in the previous examples, a plasma processing is carried out with the wafer W being secured on the electrostatic chuck 4. During this processing, however, the specified voltage is constantly impressed on the electrostatic chuck 4 without being changed.

After such a desired plasma processing is carried out, the supply of the process gas used for the plasma processing is stopped to end the plasma processing. Then, only the exposure to plasma is continued by the exposure-to-plasma means 6 to discharge the electric charge accumulated on the wafer W. At this time, the time of exposure to plasma is defined by the exposure-to-plasma defining unit 42 according to the temperature of the electrostatic chuck 4 detected by the temperature detecting unit 10 in advance. In other words, the time of exposure to plasma is defined so that the electric charge accumulated on the wafer W can be offset by the amount changed due to the change in temperature.

By exposing the wafer W to plasma for thus defined time, the electric charge accumulated on the wafer W is discharged surely, with which is avoided the problem that the wafer W becomes unremovable from the electrostatic chuck 4 which is due to the change in the attracting force working between the electrostatic chuck 4 and the wafer W caused by the change in temperature of the electrostatic chuck 4.

Consequently, in this method of removing the wafer W from the electrostatic chuck 4 carried out in this electrostatic chucking device 41, the electric charge can be also discharged from the wafer W the amount of which corresponds to the attracting force of the electrostatic chuck 4 when holding the wafer. As a result, the problem that the wafer W becomes unremovable from the electrostatic chuck 4 is avoided and the plasma processing can be carried out stably.

Figure 13:
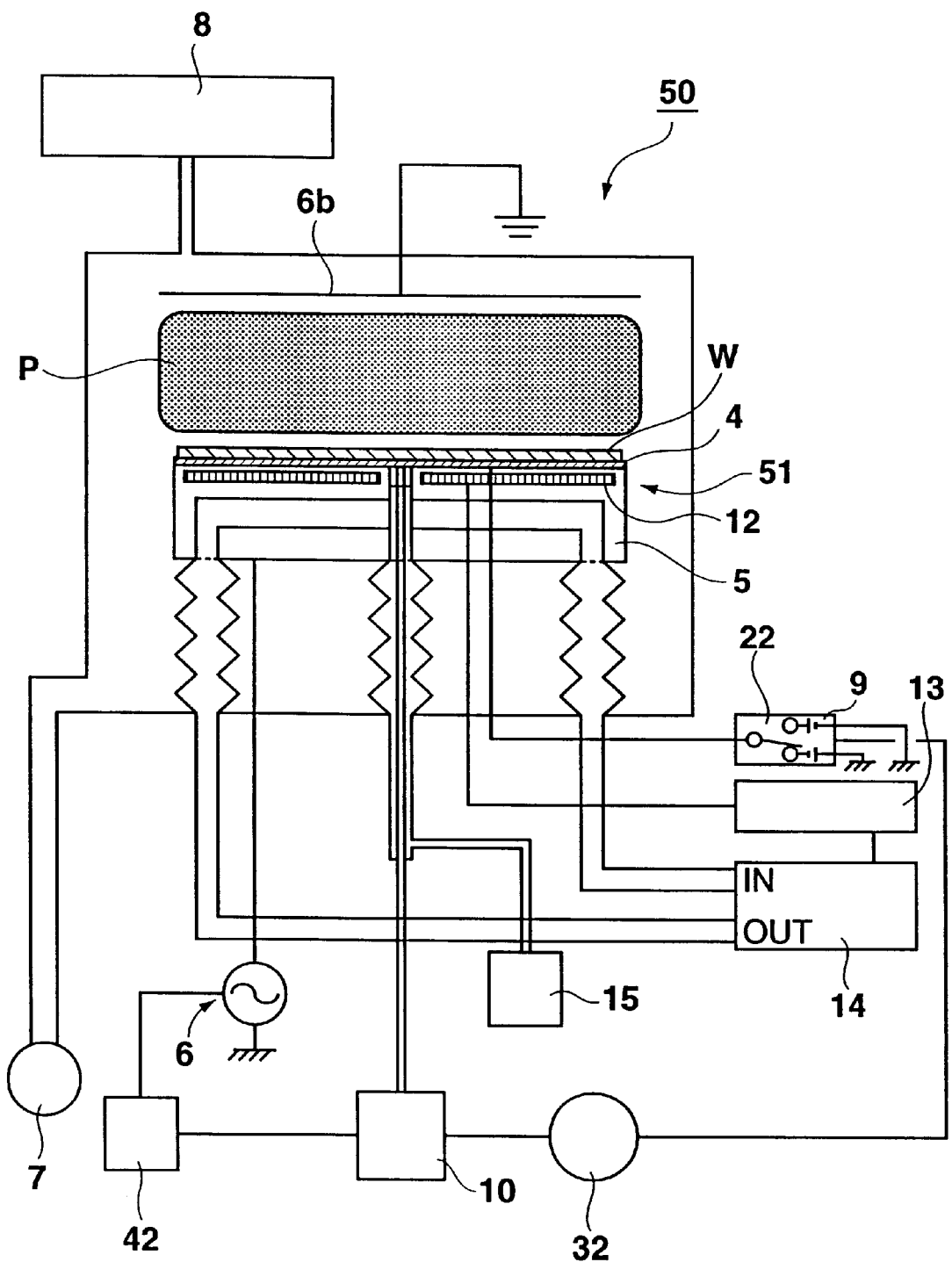
FIG. 13 is a schematic illustration showing a plasma processing system using an electrostatic chucking device as a modification of the fourth embodiment of this invention.

FIG. 13 shows an embodiment of a plasma processing system 50 provided with an electrostatic chucking device 51 according to a modification of the fourth embodiment of this invention by which a method of removing a wafer according to the fifth aspect of this invention carried out. This electrostatic chucking device 51 is a device for which the electrostatic chucking device 41 shown in FIG. 12 is made to further comprises a reversing unit 22 and a time defining unit 32 like the electrostatic chucking device 31 shown in FIG. 10. Also in this embodiment, the electrostatic chucking device 51 is indispensable for the plasma processing system 50 like the above plasma processing system 40. And, the plasma treatment system 50 can function as a plasma processing system only when the system is provided with an exposure-to-plasma means 6 of this electrostatic chucking device 51.

An example of the method of removing the wafer from the electrostatic chuck according to the fifth aspect of this invention will be explained which is carried out with the electrostatic chucking device 51 according to the modification of the fourth embodiment of this invention in the plasma processing system 50.

At first, like in the previous examples, a plasma processing is carried out with the wafer W being secured on the electrostatic chuck 4. During this processing, however, the voltage is impressed on the electrostatic chuck 4 without being changed. For example, 500V is kept being impressed constantly.

After such a desired plasma processing is carried out, the supply of the process gas used for the plasma processing is stopped to end the plasma processing. Then, in this state the polarity of the impressed voltage on the electrostatic chuck 4 is reversed by the reversing unit 22 to discharge the electric charge accumulated on the electrostatic chuck 4. At this time, the impression time of the reverse voltage is defined by the time defining unit 32 according to the temperature of the electrostatic chuck 4 detected by the temperature detecting unit 10 in advance. For example, when 500V is kept being impressed on the electrostatic chuck 4 as mentioned above, if the detected temperature becomes 200° C. while the preset temperature is 25° C., then the reverse voltage is impressed for 2 sec.

After this reverse voltage is impressed, the wafer W is again exposed to plasma by the exposure-to-plasma means 6 to discharge the electric charge accumulated in the wafer W. The time of exposure to plasma at this time is defined by the plasma defining unit 42 according to the temperature of the electrostatic chuck 4 detected by the temperature detecting unit 10 in advance. For example, as mentioned above, when 500V is kept being impressed to the electrostatic chuck 4, if the detected temperature becomes 200° C. while the set temperature is 25° C., then the wafer W is exposed to plasma for 30 sec. after the reverse voltage is impressed for 2 sec.

By impressing the reverse voltage on the electrostatic chuck 4 for thus defined time and exposing the wafer W to plasma for thus defined time, the electric charge accumulated on both the electrostatic chuck 4 and the wafer W is discharged surely, with which is avoided the problem that the wafer W becomes unremovable from the electrostatic chuck 4 which is due to the change in the attracting force working between the electrostatic chuck 4 and the wafer W caused by the change in temperature of the electrostatic chuck 4. Consequently, the plasma processing can be carried out stably.

In the embodiment shown in FIG. 13, the electrostatic chucking device 51 is described as comprising the reversing unit 22 and the time defining unit 32, but the time defining unit 32 may be replaced with the reverse voltage defining unit 23 shown in FIG. 8.

What is claimed is:

1. An electrostatic chucking device comprising:

an electrostatic chuck attracting and holding a wafer thereon;

temperature detecting means for detecting a temperature of said electrostatic chuck;

a power supply connected to said electrostatic chuck, said power supply impressing a DC voltage on said electrostatic chuck to provide said electrostatic chuck with an attracting force; and control means for controlling said attracting force constant by changing a value of said DC voltage according to said temperature of said electrostatic chuck having been detected.

2. An electrostatic chucking device as claimed in claim 1, wherein said control means controls said attracting force constant by lowering the value of said DC voltage when the temperature of said electrostatic chuck is detected to become higher than a preset temperature and by raising the value of said DC voltage when the temperature of said electrostatic chuck is detected to become lower than said preset temperature.

3. An electrostatic chucking device comprising:

an electrostatic chuck attracting and holding a wafer thereon;

temperature detecting means for detecting a temperature of said electrostatic chuck;

a power supply connected to said electrostatic chuck, said power supply impressing a DC voltage on said electrostatic chuck to provide said electrostatic chuck with an attracting force;

reversing means for reversing a polarity of said DC voltage impressed on said electrostatic chuck to supply said DC voltage as reverse voltage; and reverse voltage defining means for defining a value of said reverse voltage according to said temperature of said electrostatic chuck having been detected, when the polarity of said DC voltage is reversed.

4. An electrostatic chucking device as claimed in claim 3, wherein said reverse voltage defining means defines a value of said reverse voltage when said wafer is removed from said electrostatic chuck so that an absolute value of said reverse voltage is increased to be larger than a preset value when the temperature of said electrostatic chuck is detected to be higher than a preset temperature and is reduced to be smaller than said preset value when the temperature of said electrostatic chuck is detected to be higher than said preset temperature.

5. An electrostatic chucking device comprising:

an electrostatic chuck attracting and holding a wafer thereon;

temperature detecting means for detecting a temperature of said electrostatic chuck;

a power supply connected to said electrostatic chuck, said power supply impressing a DC voltage on said electrostatic chuck to provide said electrostatic chuck with an attracting force; and reversing means for reversing a polarity of said DC voltage impressed on said electrostatic chuck to supply said DC voltage as a reverse voltage; and impression time defining means for defining an impression time of said reverse voltage according to said temperature of said electrostatic chuck having been detected, when the polarity of said DC voltage is reversed.

6. An electrostatic chucking device as claimed in claim 5, wherein said impression time defining means defines an impression time of said reverse voltage when said wafer is removed from said electrostatic chuck so that said impression time of said reverse voltage is extended to be larger than a preset time when the temperature of said electrostatic chuck is detected to be higher than a preset temperature and is shortened to be smaller than said preset time when the temperature of said electrostatic chuck is detected to be lower than a preset temperature.

7. An electrostatic chucking device comprising:

an electrostatic chuck attracting and holding a wafer thereon;

temperature detecting means for detecting a temperature of said electrostatic chuck;

a power supply connected to said electrostatic chuck, said power supply impressing a DC voltage on said electrostatic chuck to provide said electrostatic chuck with an attracting force;

exposure-to-plasma means for exposing said electrostatic chuck to plasma; and plasma defining means for defining a time of exposure to plasma according to said temperature of said electrostatic chuck having been detected.

8. An electrostatic chucking device as claimed in claim 7, wherein said plasma defining means defines said time of exposure to plasma when said wafer is removed from said electrostatic chuck so that said time of exposure to plasma is extended to be larger than a preset time when the temperature of said electrostatic chuck is detected to be higher than a preset temperature, and is shortened to be smaller than said preset time when the temperature of said electrostatic chuck is detected to be lower than said preset temperature.

9. An electrostatic chucking device as claimed in claim 7 further comprising:

reversing means for reversing a polarity of said DC voltage impressed on said electrostatic chuck to supply said DC voltage as a reverse voltage; and impression time defining means for defining an impression time of said reverse voltage according to said temperature of said electrostatic chuck having been detected, when the polarity of said DC voltage is reversed.

10. An electrostatic chucking device as claimed in claim 9, wherein, when said wafer attracted and held on said electrostatic chuck is removed, said reversing means and impression time defining means impress said reverse voltage on said electrostatic chuck for said impression time having been defined according to said temperature of said electrostatic chuck having been detected.

11. An electrostatic chucking device as claimed in claim 7 further comprising:

reversing means for reversing a polarity of said DC voltage impressed on said electrostatic chuck to supply said DC voltage as a reverse voltage; and reverse voltage defining means for defining a value of said reverse voltage according to said temperature of said electrostatic chuck having been detected, when the polarity of said DC voltage is reverse.

12. An electrostatic chucking device as claimed in claim 11, wherein, when said wafer attracted and held on said electrostatic chuck is removed, said reversing means and reverse voltage defining means impress said reverse voltage on said electrostatic chuck with the value of said reverse voltage having been defined.

* * * * *